(12) United States Patent
Leenaerts et al.

(10) Patent No.: US 7,558,361 B2
(45) Date of Patent: Jul. 7, 2009

(54) PHASE-SWITCHING DUAL MODULUS PRESCALER

(75) Inventors: Dominicus Martinus Wilhelmus Leenaerts, Eindhoven (NL); Nenad Pavlovic, Eindhoven (NL); Ketan Mistry, Leicester (GB)

(73) Assignee: ST Wireless SA, Plan-les-Ouates (CH)

( * ) Notice: Subject to any disclaimer, the term of this patent is extended or adjusted under 35 U.S.C. 154(b) by 136 days.

(21) Appl. No.: 10/573,733

(22) PCT Filed: Sep. 28, 2004

(86) PCT No.: PCT/IB2004/051894

§ 371 (c)(1),
(2), (4) Date: Mar. 28, 2006

(87) PCT Pub. No.: WO2005/034358

PCT Pub. Date: Apr. 14, 2005

(65) Prior Publication Data

US 2006/0290433 A1    Dec. 28, 2006

(30) Foreign Application Priority Data

Oct. 1, 2003    (EP)    ................................. 03103631

(51) Int. Cl.
 *H03K 21/00*    (2006.01)
(52) U.S. Cl. ........................................ 377/47; 327/117
(58) Field of Classification Search ........................ None
See application file for complete search history.

(56) References Cited

U.S. PATENT DOCUMENTS

| | | | |
|---|---|---|---|
| 6,570,946 B1 * | 5/2003 | Homol et al. ................ | 375/371 |
| 6,583,674 B2 * | 6/2003 | Melava et al. ................ | 331/16 |
| 6,760,398 B2 * | 7/2004 | Casagrande ................... | 377/47 |
| 2001/0022537 A1 | 9/2001 | Melava et al. | |
| 2003/0068003 A1 | 4/2003 | Casagrande | |
| 2005/0063505 A1 * | 3/2005 | Dubash et al. .............. | 375/376 |

OTHER PUBLICATIONS

Krishnapura N et al., "A 5.3-GHz Programmable Divider for Hiperlan in 0.25-MUM CMOS," IEEE Journal of Solid State Circuits, IEEE Inc., New York, US, vol. 35, No. 7, Jul. 2000.

Craninckx, Jan, "Low-Phase-Noise Fully Integrated CMOS Frequency Synthesizers,"Katholieke Universiteit Leuven, ISBN 90-5682-089-3, 1997.

* cited by examiner

*Primary Examiner*—Cassandra Cox

(57) ABSTRACT

A phase-switching dual modulus prescaler having a dual modulus divider is provided. Said divider comprises a first and second divide-by-2 circuit (A;B), wherein said second divide-by-2 circuit (B) is coupled to the output of said first divide-by-2 circuit (A) and at least said second divide-by-two circuit (B) comprises a four phase output each separated by 90°. A phase selection unit (PSU) is provided for selecting one of the four phase outputs ($I_p$, $I_n$, $Q_p$, $Q_n$; INi, INni, INq, Innq) of the second divide-by-2 circuit (B). Moreover, a phase control unit is provided for providing control signal (C1, NC0; C2, NC2; C3, NC3) to the phase selection unit, wherein the phase selection unit (PSU) performs the selection of the four phase outputs ($I_p$, $I_n$, $Q_p$, $Q_n$; INi, INni, INq, Innq) according to the control signals (C0, NC0; C1, NC1; C2, NC2). Said phase selection unit (PSU) is implemented based on direct logic. The implementation of the phase selection unit based on direct logic enables a higher speed and saves area on the chip.

12 Claims, 6 Drawing Sheets

PHASE-SWITCHING DUAL MODULUS PRESCALER

Figure 1:
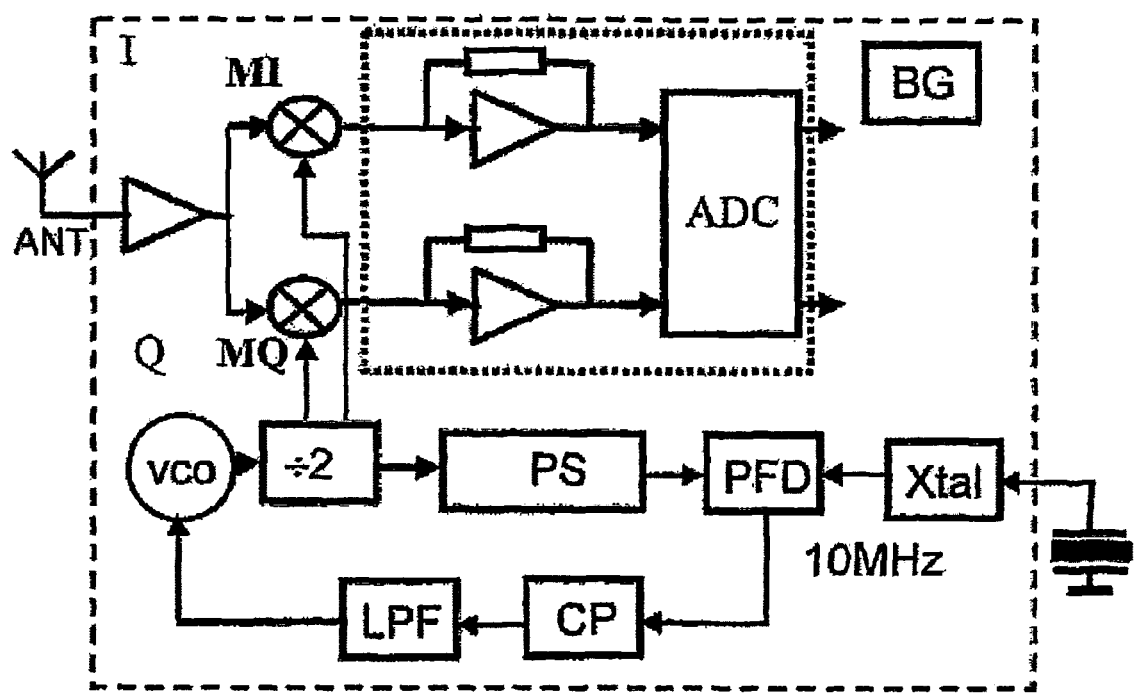

The invention relates to a phase-switching dual modulus prescaler, and a frequency synthesizer.

The phase-locked loop (PLL) method of frequency synthesize is the most commonly used method for producing high frequency oscillations in modern communication equipment. A programmable frequency synthesizer is a device which is capable of generating a signal having a frequency selected from within a range of frequencies. A programmable frequency synthesizer utilizes a digital phase-locked loop circuit using a voltage controlled oscillator VCO to generate an output signal. The PLL comprises a feedback and control loop monitoring the frequency of the synthesizer output signal, compares its frequency to that of a reference signal and controls the VCO to adjust the frequency of the synthesizer output signal. The output signal of the VCO is most often divided by a digital frequency divider, also called a prescaler, in the feedback portion of the loop, so that a feedback signal comprises a frequency which is a selected sub-multiple of a output signal of a synthesizer. In case of an integer-N divider, the divider produces an output signal for every n-th input pulse so that the input frequency is divided by n. The phase of the feedback signal is compared to that of a stable reference signal and the difference thereof defines an error signal which is feedback to the VCO. The VCO adjusts the frequency of the synthesizer in order to reduce the error signal. Usually, the reference signal has a lower frequency than the output signal of the synthesizer.

The frequency selection capabilities of the output signal of the synthesizer is determined by the programmability of the frequency divider dividing the output signal of the synthesizer by a selected divider number. This selected divider number is chosen to equal the desired frequency of the synthesizer output signal divided by the frequency of the reference signal. Therefore, selecting a different divider number results in the change of the frequency of the output signal of the synthesizer.

The two blocks of a frequency synthesizer that are working at the full frequency are the VCO and the prescaler. As mentioned above the prescaler divides the output frequency of the VCO by a certain ratio in order to get a low frequency signal. This signal is then locked by the PLL onto a stable reference frequency. In order to achieve a better frequency resolution the division ratio is typically a variable in form of N/N+1, i.e. this divider is called dual-modulus prescaler. The programmable prescaler is a N-fixed prescaler with a pulse swallow circuit realizing a N+1 division. By changing the value of N in small integer-steps the output frequency of the VCO is controlled.

In order to achieve a suitable synthesizer for high frequency a large divider ratio using high speed logic is required. However, such large divider would be very expensive because of the required large chip size. Furthermore, such a large loop divider would draw a very large current so that it is not suitable for mobile of portable applications.

A conventional high speed dual modulus prescaler comprises a synchronized divider and sometimes an asynchronized divider for large division numbers, however such high speed synchronized dual modulus dividers require a lot of power consumption.

J. Craninckx proposed in his Ph. D. thesis at the KU Leuven a concept of phase-switching dual modulus prescaler. Two divide-by-2 dividers are used together with a phase select unit in order to implement a 4/5 division. A subsequent additional 128-divider is used to generate a division number of 512. This concept may be applied for example for IEEE 802.11a. The operational frequency is from 5.15 GHz to 5.35 GHz for the UNII band and the channel spacing is 20 MHz In the case of zero-IF (ZIF) architecture, a reference frequency of 20 Mz is usually enough but for near-ZIF a reference frequency of 10 MHz is often chosen. The above-mentioned circuit furthermore comprises a modulus control unit with a five bits control signal enabling it to swallow up to 32 pulses such that any ratio between 512 and 544 can be achieved. Accordingly, an integer-N prescaler architecture is provided with a division ratio between 515 to 535.

If a reference frequency of 10 MHz is applied to the above circuit, then 10 MHz×516 equals to 5.16 GHz, which constitutes the center to the first channel from 5.15 GHz to 5.17 GHz with a channel width of 20 MHz. The next channel is then 20 MHz of from the center of the first channel, i.e. 5.17 GHz to 5.19 GHz with a center at 5.18 GHz. This center can be obtained by a division ratio of 518 with a reference frequency of 10 MHz The last or maximum channel is from 5.33 GHz to 5.35 GHz, which can be achieved by a division ratio of 534.

However, since up to 128 division signals are to be generated from the phase select signal, this will effect the speed of this circuit.

An example of a modified phase-switching dual-modulus prescaler is shown in "CMOS divide-by-⅘ for frequency synthesizer", by Kan Kwok Kei, Toby at the department of electrical and electronic engineering, HKUST, 26.04.1999. Such a prescaler consists of a first high frequency divide-by-2-circuit operating at full speed of the input frequency. The first divide-by-2-circuit is followed by a second divide-by-2-circuit which has four phase output signals each differing 90° in phase from each other. A phase selection circuit selects one of the four phase output signal of the second divide-by-2-circuit The phase select circuit comprises two switchable amplifiers and three NAND gates. In the switchable amplifiers the In-phase (I) and the quadrature (Q) signals are amplified and according to controls signals C1, C2 the positive or the negative amplification of the input signals are chosen. The speed of the switchable amplifiers constitute the limiting factor of the maximum speed of this prescaler. The phase selection circuit basically implements a multiplexer, i.e. one of the four phase output signals of the second divide-by-2circuit is selected as output thereof. According to a third control signal CO one of the outputs of the two switchable amplifiers are chosen as output. The control signals are changed at every positive edge of the final output realizing a 90° delay with respect to the present signal. Since the phase selection circuit is proceeded by two divide-by-2 circuits the 90° delay is actually corresponding to a period of the input signal of the prescaler when a N+1 division ratio is to be implemented.

With this circuit a working speed of 1.85 GHz is realized. However, for application like wireless data networking higher operation frequencies are needed.

In "A 5.3 GHz Programmable Divider for HiPerLAN in 0.25 μ CMOS", by Krishnapura et al. IEEE Journal of Solid State Circuits, vol. 35, no. 7, pp. 1019 to 1024, July 2000, a frequency divider based on a operation frequency of 5.3 GHz is shown. The frequency divider is employing phase switching and comprises a first divide-by-2 circuit and a second divide-by-2 circuit with four phase output signals. The output signals of the second divide-by-2 circuit are input to a retiming circuit which switches from one of these four output signals to another one according to control signals from a decoder. The four output signals of the second divide-by-2 circuit are separated by 90° from each other. At any given time, only one of these outputs are connected to a subsequent divider through a multiplexer. The swallowing of a cycle and thereby augmenting the total count of the frequency divider by 1 is achieved by switching to an output of the second divide-by-2 circuit that is lagging the current signal by 90°. In order to achieve an arbitory division factor the input cycles can be swallowed by changing the control inputs of the multiplexer appropriately. In the absence of phase switching the divider comprises a division factor of 4×N. However, if the phases are switched K times in each cycle of the output of the divider, K input cycles are swallowed and the division factor is augmented by K. By varying K a programmable frequency divider can be achieved. A pulse generator generates K pulses per output cycle, wherein K is set by the programming inputs of the pulse generator. A divide-by-4 counter is used as input signal of the decoder which is controlling the multiplexer. This divide-by-4 counter is clocked by the output pulses of the pulse generator and cycles through four states, each corresponding to one of the four possible connections in the multiplexer. In order to provide a glitch-free switching, the switching must be performed when the 0° and the 90° output of the second divide-by-2 circuit are both high. Furthermore, in order to assure that the clock signals as well as the control signals arrive synchronously at the inputs of the multiplexer a buffer is implemented in the clock line with a delay that is the same as that of the control signal generator, in order to correct timing inaccuracies.

It is therefore an object of the present invention to provide an improved high speed prescaler.

This object is solved by a phase-switching dual modulus prescaler according to claim 1, and a frequency synthesizer according to claim 8.

Therefore, a phase-switching dual modulus prescaler having a dual modulus divider is provided. Said divider comprises a first and second divide-by-2 circuit (A;B), wherein said second divide-by-2 circuit (B) is coupled to the output of said first divide-by-2 circuit (A) and at least said second divide-by-2 circuit (B) comprises a four phase output each separated by 90°. A phase selection unit (PSU) is provided for selecting one of the four phase outputs $I_p$, $I_n$, $Q_p$, $Q_n$; INi, INni, INq, INnq of the second divide-by-2 circuit (B). Moreover, a phase control unit is provided for providing control signals (C0, NC0; C1, NC1; C2, NC2) to the phase selection unit, wherein the phase selection unit PSU performs the selection of the four phase outputs $I_p$, $I_n$, $Q_p$, $Q_n$; INi, INni, INq, INnq according to the control signals C0, NC0; C1, NC1; C2, NC2. Said phase selection unit (PSU) is implemented based on direct logic.

The implementation of the phase selection unit based on direct logic enables a higher speed as compared to implementations with switchable amplifiers and saves area on the chip.

According to an aspect of the invention, the output OUT of the phase selection unit PSU is implemented according to the following logic code:

OUT=$\overline{NC0}$•$\overline{NC1}$•IN$i$+$\overline{NC0}$•$\overline{C1}$•IN$ni$+$\overline{C0}$•$\overline{NC2}$•IN$nq$+$\overline{C0}$•$\overline{C2}$•IN$q$, wherein +, •, represent an OR-, AND, and NAND functions, respectively. By this arrangement a proper signal representation of the control signals C0, C1, C2 out of the output signals of the divider is made possible.

According to a further aspect of the invention a divide-by-4 circuit UA is provided being coupled to the output of the phase selection unit PSU. Said divide-by-4 circuit UA comprises a sixth and seventh divide-by-2 circuit F, G each with a four phase output $I_p$, $I_n$, $Q_p$, $Q_n$ separated by 90°. Said seventh divide-by-2 circuit G is coupled to the quadrature output Qp, Q of the sixth divide-by-2 circuit F.

According to still a further aspect of the invention, said phase control unit (RTU) comprises a fourth and fifth divide-by-2 circuit D, E each with a four phase output $I_p$, $I_n$, $Q_p$, $Q_n$ separated by 90°. Said fourth and fifth divide-by-2 circuit D, E are coupled in series. The In-phase output $I_p$, $I_n$ of the fifth divide-by-2 circuit E corresponds to the control signal C0. The In-phase output $I_p$, $I_n$ of the fourth divide-by-2 circuit D corresponds to the control signal C1. The quadrature phase output $Q_p$, $Q_n$ of the fourth divide-by-2 circuit E corresponds to the control signal C2.

According to still a further aspect of the invention said phase control unit RTU further comprises a D-latch DL coupled to the input of the fifth divide-by-2 circuit E. Said D-latch DL receives the previous state of the In-phase output Ip, $I_n$ of the seventh divide-by-2 circuit G and a signal 'modul' indicating the number of phase switching as input signals.

According to a preferred aspect of the invention, said prescaler further comprises a synchronization loop coupled to the dual modulus divider 10 for reclocking the dual modulus divider 10.

Figure 2:
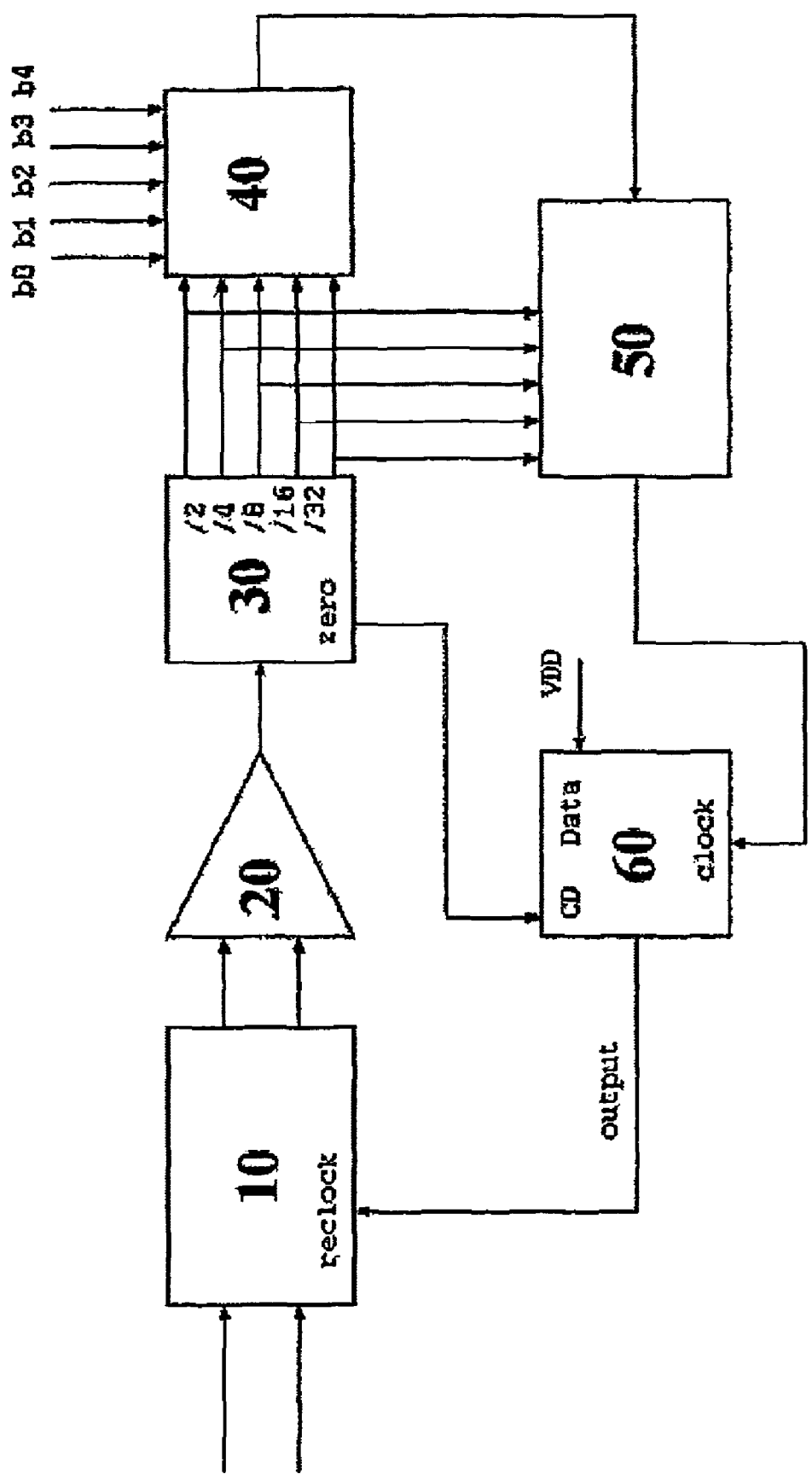
Figure 3:
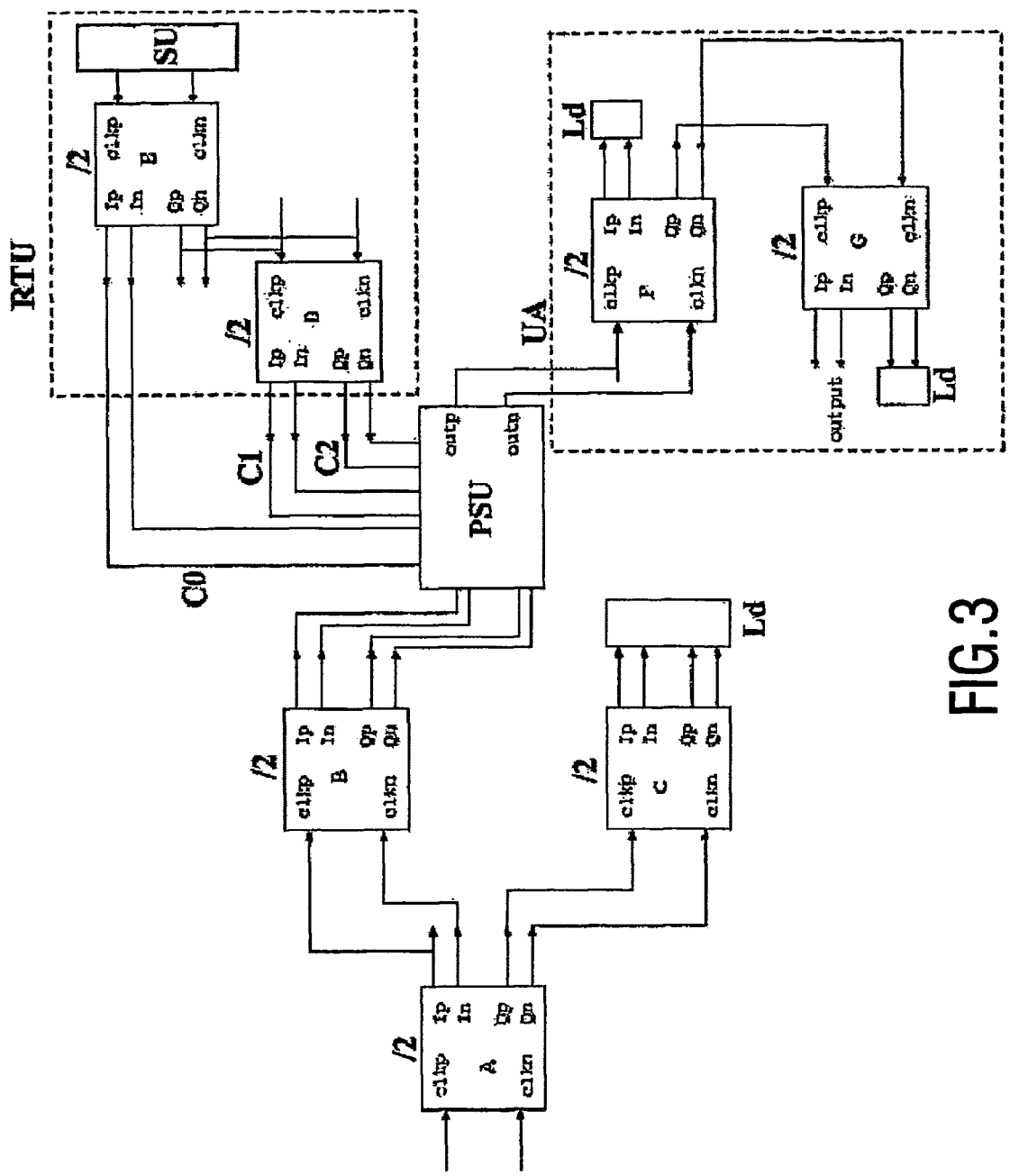
Figure 4:
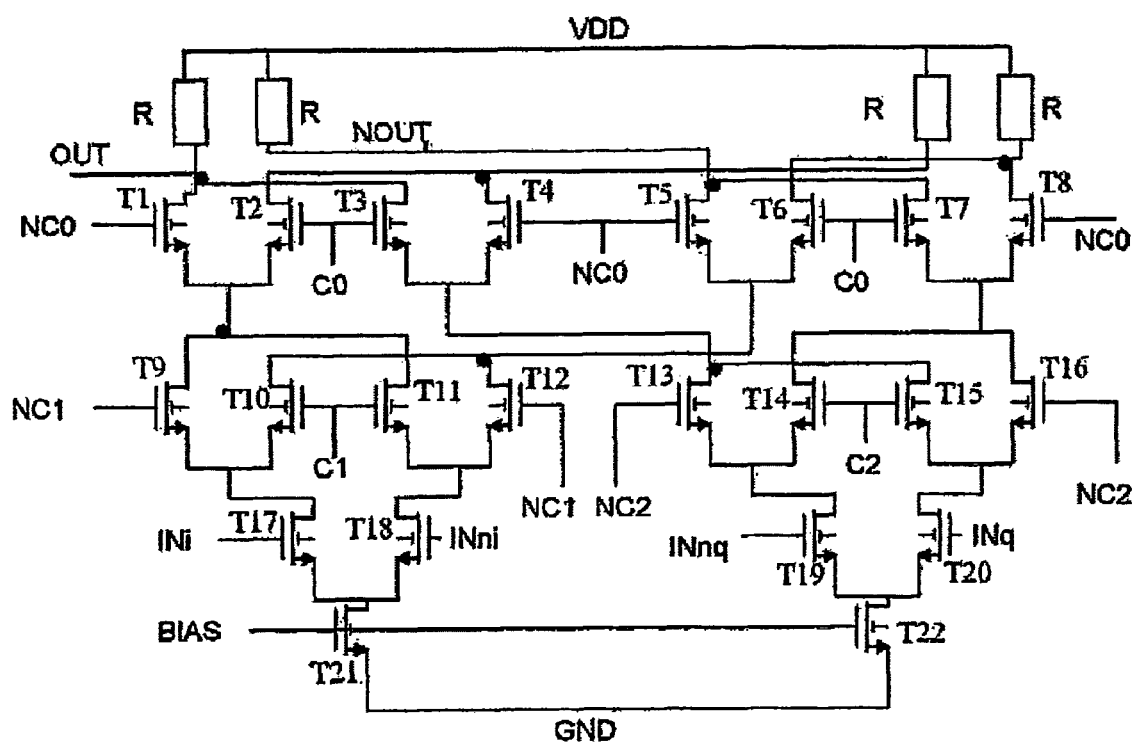
Figure 5:
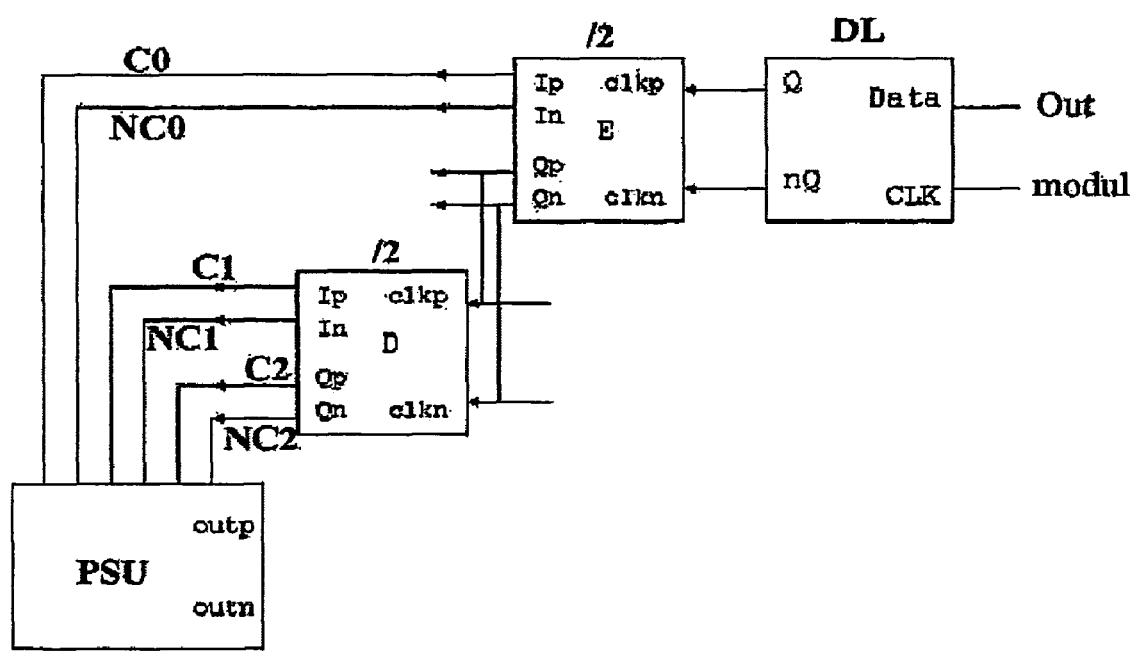
Figure 6:
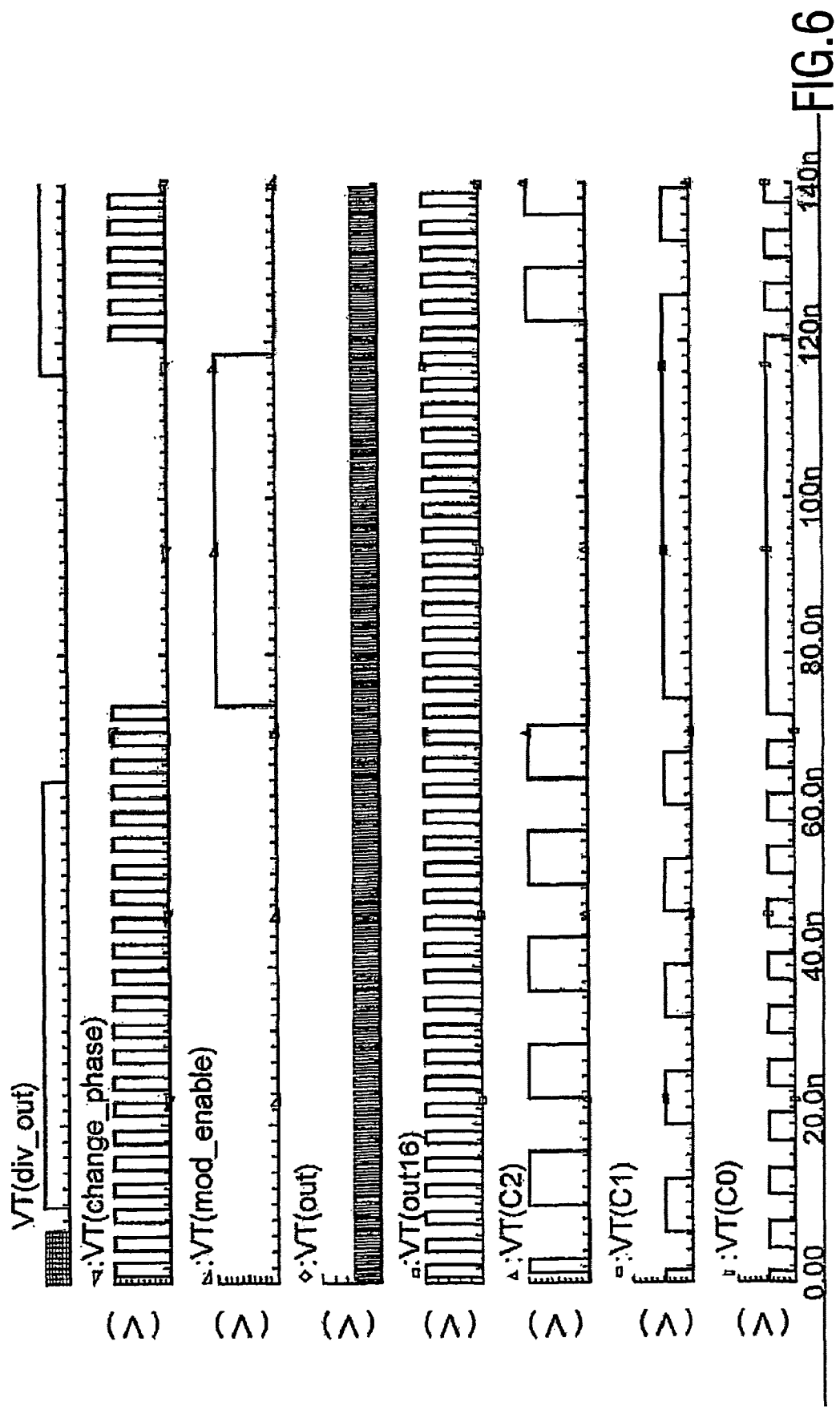

The invention as well as the embodiments thereof will now be described in more detail with reference to the drawings, in with:

FIG. 1 shows a block diagram of a receiver,

FIG. 2 shows a block diagram of a programmable prescaler PS of FIG. 1 according to the invention, FIG. 3 shows a 16/17 divider of FIG. 2, according to the invention, FIG. 4 shows a circuit diagram of the phase selection unit of FIG. 3, according to the invention, FIG. 5 shows a retiming unit and a phase selection unit of FIG. 4, according to the invention, and FIG. 6 shows a timing diagram of the divider, according to the invention.

FIG. 1 shows a block diagram of a receiver which can be used in the IEE 802.11a standard. The upper part of FIG. 1 shows an antenna ANT connected to a low noise amplifier LNA, which is connected to a first and second mixer MI, MQ, which are in turn connected to an analog-digital converter ADC. The lower part of FIG. 1 shows an implementation of a PLL-circuit. The PLL circuit comprises a voltage controlled oscillator VCO, a first divide-by-2 circuit, a prescaler PS, a phase frequency detector PFD, a reference crystal Xtal, a charge pump CP and a low pass filter LPF. The output of the divide-by-two circuit is coupled to the first and second mixer MI, MQ.

In the following the prescaler PS will be described in more detail.

FIG. 2 shows a block diagram of the prescaler of FIG. 1. The programmable prescaler comprises a 16/17 divider 10, a buffer 20, a divider 30, a decision unit 40, a synchronizing unit 50, and a D-flip-flop 60. The 16/17 divider 10 is connected to the buffer 20, which in turn is connected to the divider 30. The divider 30 has five output signals, namely /2, /4, /8, /16 and /32 and a zero detection output 'zero'. These five output signals are input to the decision unit 40 and the synchronizing unit 50. The decision unit 40 furthermore receives a 5 bit control signal b0, b1, b2, b3 and b4 and the output of the decision unit 40 forms an input to the synchronizing unit 50. The output of the synchronizing unit 50 is input to the clock input of the D-flip-flop 60. The input 'data' thereof is connected to the supply voltage VDD. The output signal 'zero' of divider 30 is connected to the CD input of the D-flip-flop 60. The output signal of the D-flip-flop 60 is feedback to the 16/17 divider 10 and input to its 'reclock' input.

The divider 30 generates the signals /2, /4, /8, /16 and /32, which are input to the decision unit 40. These signals are used to generate a signal which indicates how many pulses should be swallowed, 1, 2, . . . , 32. This is performed on the basis of the 5 bit control signal b0, b1, b2, b3 and b4.

The swallowing of one pulse is performed by delaying one or more pulses, i.e. a frequency division is performed related to your input signal. The swallowing of one pulse is identical to a divide-by-2.

If the synchronizing unit detects, e.g. 11111, then the clock input of the D-flip-flop 60 is enabled and the 16/17 divider 10 is reclocked, if a 0 is detected at the 'zero' output of the divider 30. Thereby a synchronization pulse is implemented, in order to reclock the circuit and to remove delays due to latches. Accordingly, a programmable prescaler is realized which is able to divide the input signal by any integer between 512 and 544, since 16*32=512 and up to 32 pulses can be swallowed, resulting in 512+32=544.

FIG. 3 shows a block diagram of the 16/17 divider 10 of FIG. 2. The divider 10 comprises a first and second divide-by-2 circuit A, B. The second divide-by-2 circuit B is connected with its inputs to the In-phase outputs Ip, In of the first divide-by-2 circuit A. A third divide-by-2 circuit C is connected to the quadrature output Qp, $Q_n$ of the first divide-by-2 circuit A, and its outputs Ip, In, Qp, $Q_n$ are connected to a load Ld. Additionally, the divider 10 comprises a phase selection unit PSU, a retiming unit RTU and a divide-by-four unit UA. The retiming unit RTU generates three control signals C0, C1, C2 for controlling the phase switching in the phase selection unit PSU. The four phase output signals of the second divide-by-2 circuit B are input to the phase selection unit PSU. According to the control signals C0, C1, C2 provided by the retiming unit RTU, the phase selection unit PSU selects one of the four phase output signals of the second divide-by-2 circuit B and outputs this signal to the divide-by-four unit UA. The third divide-by-2 circuit C is provided for proper loading.

The retiming unit RTU is provided in order to drive the phase selecting unit PSU and to control the phase switching by the control signals C0, C1, C2. The retiming unit RTU comprises a fourth and fifth divide-by-2 circuit D, E and a swallow unit SU. The swallow unit determines how many pulses are to be swallowed.

The divide-by-4 unit UA comprises a sixth and seventh divide-by-2 circuit F, G. The input of the sixth divide-by-2 circuit F is connected to the output of the phase selection unit PSU and its In-phase output signals $I_p$, $I_n$ are connected to a load Ld, while its quadrature output $Q_p$, $Q_n$ is connected to the input of the seventh divide-by-2 circuit. Finally, the In-phase output signals of the seventh divide-by-2 circuit G constitutes the output of the 16/17 divider 10.

If no cycle-slip occurs, a total division of 16 can be achieved, since in this case four divide-by-2 circuits A, B, F, G are connected in series. Accordingly, if a cycle-slip occurs a division-by-17 can be realized with the divider 10.

The phase selecting unit PSU receives the four phase output signals of the second divide-by-2 circuit B as input signals. Since these signals differ by 90° in phase with each other the following signals are provided at the input of the phase selecting unit PSU: INi (0°, Ip), INq (90°, Qp), INni (180°, In) and INnq (270°, Qn). The phase selecting unit PSU selects one of the four input signals according to the three control signals C0, C1 and C2 as well as the inversions thereof.

If we assume that the output of the phase selecting unit PSU is initially connected to INi, then the output will be connected to INq after an raising edge of INi. Accordingly, the output of the phase selecting unit PSU is delayed with ¼ T period of the input signals of a phase selecting unit PSU. However, since the input signals of the phase selecting unit PSU have been divided by two divide-by-2 circuits, T will be 4*To with To being the period of the input signal of the 16/17 divider 10. As a result, one complete period To of the input signal is delayed by the phase selection, i.e. a phase switching will result in a delay of one complete period of the input signal of the divider 10.

The waveforms Ip, Qp, In, Qn correspond to the phases 0°, 90°, 180°, 270° of the second divide-by-2 circuit B, respectively, i.e. the period T thereof equals 4*T0 the period of the input signal of the 16/17 divider. As mentioned above, if a division-by-16 is to be realized by the 16/17 divider, then no cycle-slip and no phase switching will occur i.e. the output of the PSU corresponds to a divide-by-4. However, if a division-by-17 is to be realized, a phase switching will occur. The switching occurs in a fixed sequence and preferably in the sequence I, Q, nI, nQ, i.e. 0°, 90°, 180°, 270°. Therefore, if the input signal INi, i.e. $I_p$, is initially connected to the output of the phase selection unit PSU, then the input signal INq, i.e. $Q_p$, will be selected and forms the output of the phase selection unit PSU. As soon as this switching occurs, an additional delay of 90°, which corresponds to a period of the input signal of the 16/17 divider, is introduced at the output of the PSU, i.e. the output of the PSU corresponds to a divide-by-5. In other words, the phase selection unit PSU introduces a delay or an extra cycle-slip to its input signal.

FIG. 4 shows a circuit diagram of a phase selecting unit PSU of FIG. 3. The circuit comprises 22 transistors T1-T22 and four resistors R. This circuit is a particular implementation of the following logic code:

$$\mathrm{OUT} = \overline{NC0 \cdot NC1 \cdot INi} + \overline{NC0 \cdot C1 \cdot INni} + \overline{C0 \cdot NC2 \cdot INnq} + \overline{C0 \cdot C2 \cdot INq},$$

wherein +, •, ‾ represent an OR-, AND, and NAND functions, respectively.

OUT represents the output signal of the phase selecting unit PSU and INi, INni, INnq, INq represent the four input signals of a phase selecting unit PSU. C0, C1 and C2 represent the control signals and NC0, NC1 and NC2 represent the inversions thereof. The signal C1 selects between the input signals INi and INni, i.e. between 0 and 180°. The signal C2 selects between INq and INnq, i.e. between 90° and 270°. The result of the selection according to the control signal C1 is Pi and the result of the selection of the control signal C2 is Pq. The control signal C0 selects between the results Pi and Pq. The input signal INi is input to the transistor T17, the input signal INni to the transistor T18, the input signal INq to the transistor T20 and the input signal INnq to the transistor T19, respectively. In the next row of transistors, i.e. T9-T16, the selection is performed according to the states of C1, and C2, in order to achieve the selected signals Pi, Pq. The next row of transistors, i.e. T1-T8, is used to select one of the two selection signals Pi, Pq according to the state of the control signal C0.

The above logic code comprises four branches which are OR-connected. The first branch is realized by the transistors T1, T9 and T17. The second is implemented by the transistors T1, T11 and T18. The third branch is implemented by transistors T3, T13 and T19. The fourth branch is implemented by transistors T3, T15 and T20.

The AND logic function, e.g. the first branch NC0•NC1•INi, is implemented differentially by current switching. The NAND logic is implemented by differentially switching the inputs in the current domain. The OR logic is implemented by adding the output current of the NAND logic in the loads R. The advantage of such an implementation is an increased speed due to the differential implementation in the current domain.

FIG. 5 shows a block diagram of the phase selecting unit PSU and the retiming unit RTU of FIG. 3. As mentioned above the retiming unit RTU is implemented by a fourth and fifth divide-by-2 circuit D, E. The swallow unit SU is implemented by a D-latch DL. The D-latch DL receives the output 'out' of the 16/17 divider 10 as data input and a modulator signal 'modul' as clock input. The output signals Q, nQ of the D-latch DL are input to the fourth divide-by-2 circuit E, which provides four phase output signals each differing in 90° in phase. The In-phase output signal Ip, In thereof constitutes the control signal C0, NC0. The quadrature output Qp, Qn thereof is input to the fourth divide-by-2 circuit D. The In-phase output signal Ip, In of the fourth divide-by-2 circuit D constitutes the control signal C1, NC1 and the quadrature output signal $Q_p$, $Q_n$ constitutes the control signal C2, NC2. As mentioned above, these three control signals C0, C1 and C2 are input to the phase selecting unit PSU for controlling the phase selection therein. The modulator pulse represents the number of phase switching which should occur. The signal 'out' represents the previous state of the phase selecting unit PSU, i.e. I, nI, Q, nQ. The phase switching is performed in a fixed sequence, namely from I to Q, then to nI and to nQ, i.e. 0°, 90°, 180° and 270°. However, an alternative sequence is also possible.

FIG. 6 shows a timing diagram of the divider. The topmost waveform, i.e. VT(div_out) corresponds to the output of the divider. The lowest three waveforms, i.e. VT(C0), VT(C1), VT(C2), correspond to the control signals C2, C1, C0, respectively. The waveform VT(mod_enable) correspond to the modulator input 'modul' of the D-latch DL of the retiming unit RTU. The waveform VT(out) corresponds to the output of the phase selection unit PSU. The waveform VT(outl6) corresponds to the output of the seventh divide-by-2 circuit F, i.e. the output of the 16/17 divider 10.

From the waveforms of the control signals C0, C1, C2 it can be seen that the waveform of C2 is 90° shifted with regards to the waveform of C1, since C1 and C2 correspond to the IN-phase and the quadrature phase of the output of the fourth divid-by-2 circuit D, respectively. The period of the signals C1, C2 is twice as high as the period of the signal C0 due to an additional divide-by-2 operation o the fourth divide-by-two circuit D.

Summarizing it can be said, that rather than using a 4/5 divider as the base, a single fixed 16/17-frequency-divider followed by a programmable 5 stage integer-2 divider, i.e. controlled with 5 bits, was chosen. The advantage is that the block after the phase selector is now only needs to generate the signals /2, /4, /8, /16 and /32. In principle a 32/33 divider can do the job in combination with a 4-stage integer-2 divider, however 32/33 (but also the 16/17 divider) operates at 5 GHz at their input which makes it hard to realize a 32/33-divider. A synchronizer including final D-flip-flop are needed to do time synchronization. The synchronizer and D-flip-flop generate the final output signal, i.e. the input signal divided by any integer between 512 and 544 and realizes the synchronization pulse to reclock the circuitry and remove delays due to the latches.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be construed as limiting the scope of the claims.

The invention claimed is:

1. Phase-switching dual modulus prescaler, comprising a dual modulus divider (10) comprising:

a first and second divide-by-2 circuit (A;B), wherein said second divide-by-2 circuit (B) is coupled to the output of said first divide-by-2 circuit (A) and at least said second divide-by-two circuit (B) comprises four phase outputs ($I_p$, $I_n$, $Q_p$, $Q_n$; INi, IiNni, INq, INnq) each separated by 90°;

a phase selection unit (PSU) for selecting one of the four phase outputs ($I_p$, $I_n$, $Q_p$, $Q_n$; INi, INni, INq, INnq) of the second divide-by-2 circuit (B);

a phase control unit (RTU) for providing control signal (C1, NC0; C2, NC2; C3, NC3) to the phase selection unit (PSU), wherein the phase selection unit (PSU) performs the selection of the four phase outputs ($I_p$, $I_n$, $Q_p$, $Q_n$; INi, INni, INq, INnq) according to the control signals (C0, NC0; C1, NC1; C2, NC2); and said phase selection unit (PSU) is implemented based on direct logic;

wherein the output (OUT) of the phase selection unit (PSU) is implemented according to the following logic code:

OUT=$\overline{NC0 \cdot NC1 \cdot INi} + \overline{NC0 \cdot C1 \cdot INni} + \overline{C0 \cdot NC2 \cdot INnq} + \overline{C0 \cdot C2 \cdot INq}$, +, •, represent an OR-, AND, and NAND functions, respectively.

2. Prescaler according to claim 1, further comprising a divide-by-4 circuit (UA) coupled to the output of the phase selection unit (PSU), said divide-by-4 circuit (UA) comprises a sixth and seventh divide-by-2 circuit (F,G) each with four phase outputs ($I_p$, $I_n$, $Q_p$, $Q_n$) separated by 90°, said seventh divide-by-2 circuit (G) being coupled to the quadrature output ($Q_p$, $Q_n$) of the sixth divide-by-2.

3. Prescaler according to claim 1, wherein the phase control unit (RTU) comprises a fourth and fifth divide-by-2 circuit (D, E) each with four phase outputs ($I_p$, $I_n$, $Q_p$, $Q_n$) separated by 90°, said fourth and fifth divide-by-2 circuit (D, E) being coupled in series, the In-phase output signal ($I_p$, $I_n$) of the fifth divide-by-2 circuit (E) corresponds to the control signal (C0), the In-phase output signal ($I_p$, $I_n$) of the fourth divide-by-2 circuit (D) corresponds to the control signal (C1), the quadrature phase output signal ($Q_p$, $Q_n$) of the fourth divide-by-2 circuit (E) corresponds to the control signal (C2).

4. Prescaler according to claim 3, wherein the phase control unit (RTU) further comprises a D-latch (DL) coupled to the input of the fifth divide-by-2 circuit (E), the D-latch (DL) receives the previous state of the In-phase output ($I_p$, $I_n$) of the seventh divide-by-2 circuit (G) and a signal (modul) indicating the number of phase switching as input signals.

5. Prescaler according to claim 1, wherein said dual modulus divider (10) is a 16/17 divider.

6. Prescaler according to claim 1, further comprising a synchronization loop coupled to the dual modulus divider (10) for reclocking the dual modulus divider (10).

7. Frequency synthesizer comprising a prescaler according to claim 1.

8. Phase-switching dual modulus prescaler, comprising a dual modulus divider (10) comprising:
- a first and second divide-by-2 circuit (A;B), wherein said second divide-by-2 circuit (B) is coupled to the output of said first divide-by-2 circuit (A) and at least said second divide-by-two circuit (B) comprises four phase outputs ($I_p$, $I_n$, $Q_p$, $Q_n$; INi INni, INq, INnq) each separated by 90°;
- a phase selection unit (PSU) for selecting one of the four phase outputs ($I_p$, $I_n$, $Q_p$, $Q_n$; INi, INni, INq, INnq) of the second divide-by-2 circuit (B);
- a phase control unit (RTU) for providing control signal (C1, NC0; C2, NC2; C3, NC3) to the phase selection unit (PSU), wherein the phase selection unit (PSU) performs the selection of the four phase outputs ($I_p$, $I_n$, $Q_p$, $Q_n$; INi, INni, INq, INnq) according to the control signals (C0, NC0; C1, NC1; C2, NC2); and
- said phase selection unit (PSU) is implemented based on direct logic;

wherein
the phase control unit (RTU) comprises a fourth and fifth divide-by-2 circuit (D, E) each with four phase outputs ($I_p$, $I_n$, $Q_p$, $Q_n$) separated by 90°, said fourth and fifth divide-by-2 circuit (D, E) being coupled in series, the In-phase output signal ($I_p$, $I_n$) of the fifth divide-by-2 circuit (E) corresponds to the control signal (C0), the In-phase output signal ($I_p$, $I_n$) of the fourth divide-by-2 circuit (D) corresponds to the control signal (C1), the quadrature phase output signal ($Q_p$, $Q_n$) of the fourth divide-by-2 circuit (E) corresponds to the control signal (C2).

9. Prescaler according to claim 8, wherein
the phase control unit (RTU) further comprises a D-latch (DL) coupled to the input of the fifth divide-by-2 circuit (E), the D-latch (DL) receives the previous state of the In-phase output ($I_p$, $I_n$) of the seventh divide-by-2 circuit (G) and a signal (modul) indicating the number of phase switching as input signals.

10. Prescaler according to claim 8, wherein said dual modulus divider (10) is a 16/17 divider.

11. Prescaler according to claim 8, further comprising a synchronization loop coupled to the dual modulus divider (10) for reclocking the dual modulus divider (10).

12. Frequency synthesizer comprising a prescaler according to claim 8.

\* \* \* \* \*